(12) United States Patent
Ito

(10) Patent No.: US 8,987,793 B2
(45) Date of Patent: Mar. 24, 2015

(54) FIN-BASED FIELD-EFFECT TRANSISTOR WITH SPLIT-GATE STRUCTURE

(71) Applicant: Broadcom Corporation, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 16 days.

(21) Appl. No.: 13/898,414

(22) Filed: May 20, 2013

(65) Prior Publication Data

US 2014/0312396 A1  Oct. 23, 2014

Related U.S. Application Data

(60) Provisional application No. 61/815,231, filed on Apr. 23, 2013.

(51) Int. Cl.
*H01L 29/76* (2006.01)
*H01L 29/78* (2006.01)

(52) U.S. Cl.
CPC ................................. *H01L 29/785* (2013.01)
USPC .......................................... 257/288; 257/368

(58) Field of Classification Search
USPC ................................................ 257/288, 368
See application file for complete search history.

(56) References Cited

U.S. PATENT DOCUMENTS

| | | | | |
|---|---|---|---|---|
| 8,334,181 | B1 * | 12/2012 | An et al. | 438/268 |
| 8,785,273 | B2 * | 7/2014 | Cheng et al. | 438/241 |
| 2012/0032732 | A1 * | 2/2012 | Xiao et al. | 327/537 |
| 2012/0049279 | A1 * | 3/2012 | Shrivastava et al. | 257/347 |
| 2012/0327719 | A1 * | 12/2012 | Lue | 365/185.23 |

* cited by examiner

*Primary Examiner* — Thanh V Pham
(74) *Attorney, Agent, or Firm* — McDermott Will & Emery LLP

(57) ABSTRACT

A semiconductor device based on split multi-gate field-effect transistor radio frequency devices is provided. The semiconductor device includes a substrate and a gate structure above the substrate and orthogonal to a channel axis. The semiconductor device also includes a semiconductor fin structure above the substrate along the channel axis. The semiconductor also includes a gate oxide region beneath the gate structure and in contact with the gate structure and the semiconductor fin structure. The gate oxide region has a first region with a first thickness and a first length. The gate oxide region also has a second region with a second thickness and a second length. The first thickness is greater than the second thickness. The first region and the second region are formed side-by-side along the channel axis.

20 Claims, 5 Drawing Sheets

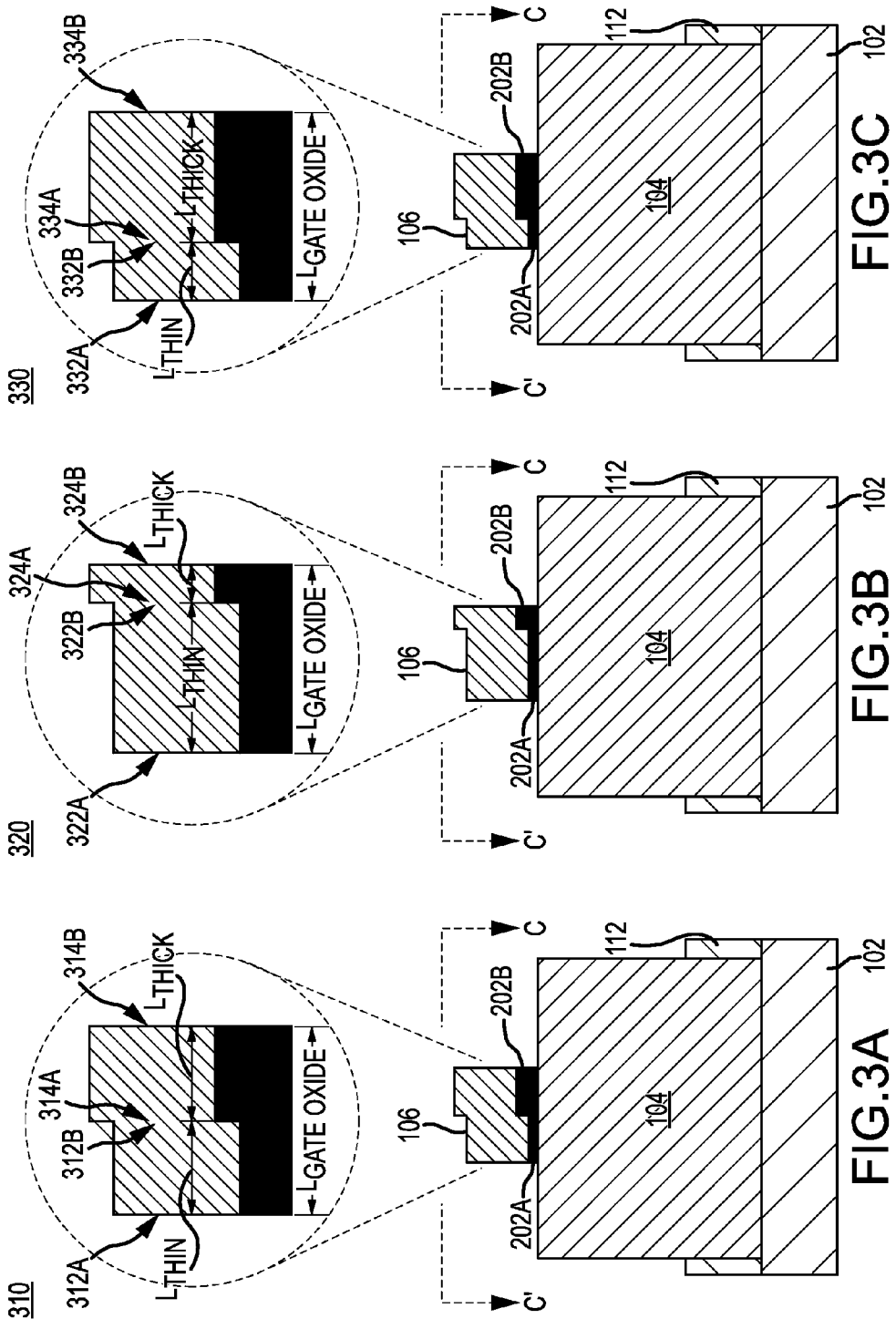

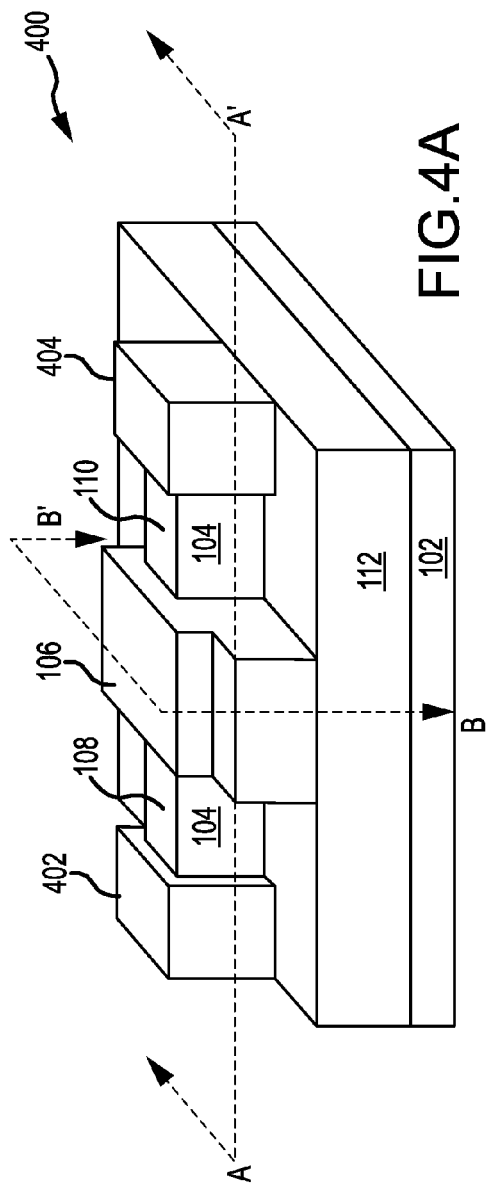
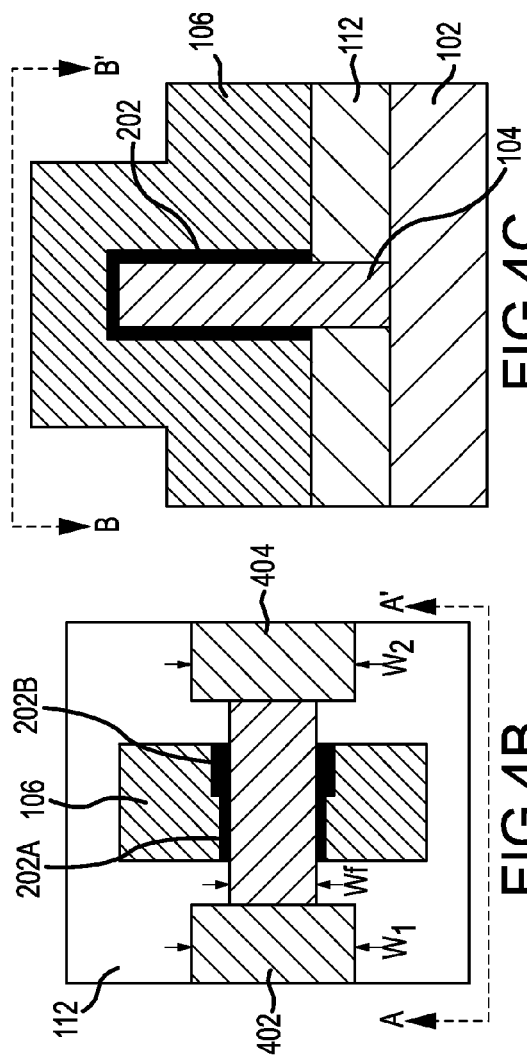
FIG.4A
FIG.4B
FIG.4C

US 8,987,793 B2

FIN-BASED FIELD-EFFECT TRANSISTOR WITH SPLIT-GATE STRUCTURE

CROSS-REFERENCE TO RELATED APPLICATIONS

The present application claims the benefit of U.S. Provisional Patent Application Ser. No. 61/815,231, titled "SPLIT MULTI-GATE FIELD-EFFECT TRANSISTOR," filed on Apr. 23, 2013, which is hereby incorporated by reference in its entirety for all purposes.

BACKGROUND

Technology scaling has led to the development of fin-based field-effect transistor (FET) structures as an alternative to the bulk-Silicon (or bulk-Si) metal-oxide-semiconductor FET structure for performance enhancements. The fin-based FET utilizes a silicon fin to wrap the conducting channel, which forms the body of the transistor. In effect, the gate electrode of the transistor straddles or surrounds the fin. During operation, current flows between the source and drain electrodes of the transistor along the gated sidewall surfaces of the fin.

A consequence of FET device scaling is a requirement to reduce operating voltages. The reduced operating voltages are required because FET device scaling needs a relatively thin gate dielectric layer to produce the desired electrical characteristics in the scaled-down transistor. Although the thinner gate dielectric provides a relatively large cutoff frequency band at high frequencies, the reliability of thinner gate dielectrics becomes increasingly limited by time-dependent dielectric breakdown (TDDB), hot carrier injection (HCI), and negative bias temperature instability (NBTI) factors. Without a reduction in operating voltage, the electrical field impressed across the thinner gate dielectric during circuit operation can be relatively high enough for dielectric breakdown to become a problem.

Integrated circuit designs may require both low operating voltage FETs for their ability to operate at high frequencies, and high operating voltage FETs for their ability to interface with high voltage signals of auxiliary devices. However, integrated circuit design techniques often increase the fabrication cost and/or complexity by requiring additional process steps along with additional substrate masking.

SUMMARY

A system and/or circuit is provided for a split multi-gate field effect transistor, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

FIGS. 3A-3C show cross-sectional views of the fin-based semiconductor device along a C-C' axis in FIG. 1 according to one or more implementations.

FIGS. 4A-4C show multiple views of the fin-based semiconductor device with source/drain growth according to one or more implementations.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

In one or more implementations, a fin-based multi-gate semiconductor device with a split-gate structure such that the semiconductor device can support, among others, both low operating voltages (e.g., core) and high operating voltages (e.g., input/output) with the flexibility of varying the lengths of respective gate oxide regions based on one or more design requirements (e.g., cut-off frequency ($f_t$), multiple reliability factors).

In some implementations, a semiconductor device based on split multi-gate field-effect transistor radio frequency devices is provided. The semiconductor device includes a substrate and a gate structure above the substrate and orthogonal to a channel axis. The semiconductor device also includes a semiconductor fin structure above the substrate along the channel axis. The semiconductor also includes a gate oxide region beneath the gate structure and in contact with the gate structure and the semiconductor fin structure. The gate oxide region has a first region with a first thickness and a first length. The gate oxide region also has a second region with a second thickness and a second length. The first thickness is greater than the second thickness. The first region and the second region are formed side-by-side along the channel axis.

Figure 1:
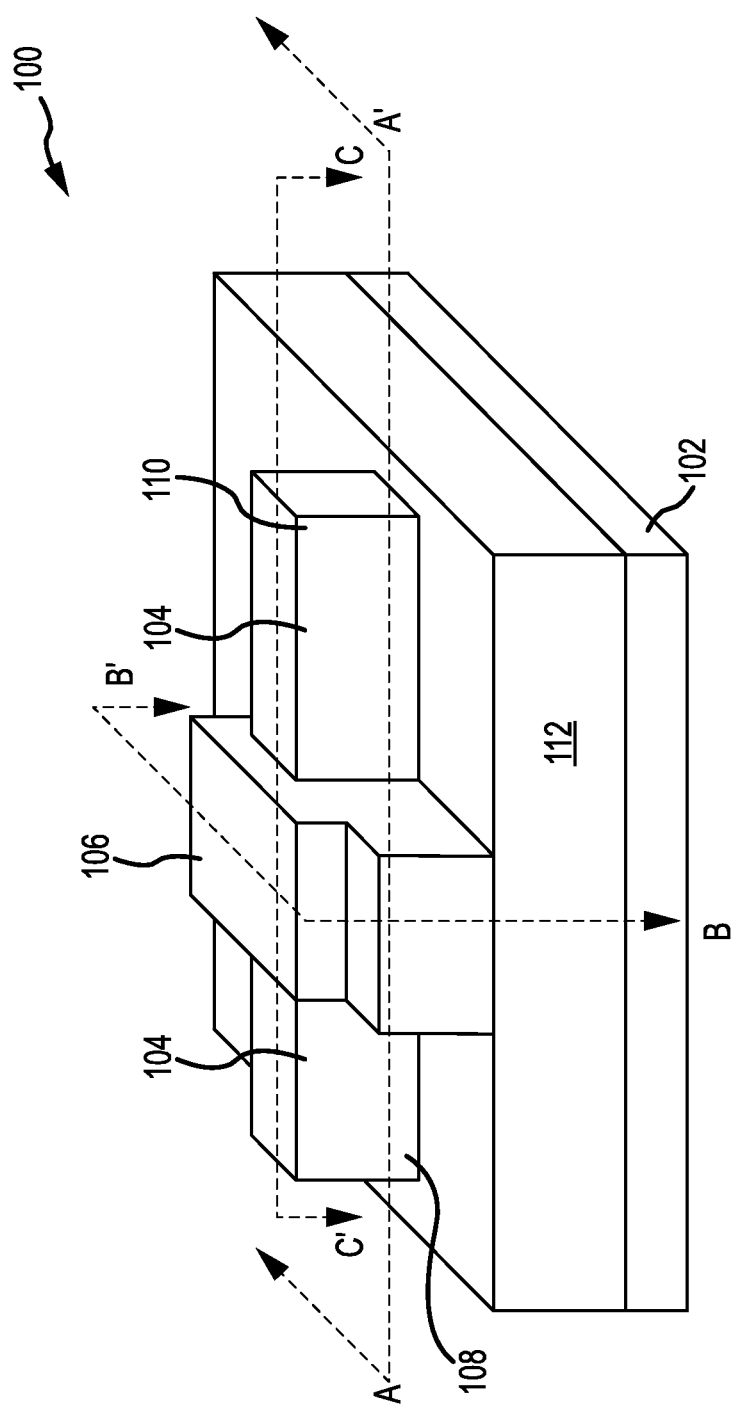
FIG. 1 illustrates a perspective view of a fin-based semiconductor device in accordance with one or more implementations.

FIG. 1 illustrates a perspective view of fin-based semiconductor device 100 in accordance with one or more implementations. Fin-based semiconductor device 100 includes substrate 102 supporting a diffusion fin or semiconductor fin structure 104. Gate structure 106 is deposited over a portion of semiconductor fin structure 104 to form a gated channel between source 108 and drain 110. In effect, gate structure 106 straddles or surrounds semiconductor fin structure 104. During operation, current flows between source 108 and drain 110 along the gated sidewall surfaces of semiconductor fin structure 104.

According to some implementations, gate structure 106 is formed using a poly-silicon material or a metal. Fin-based semiconductor device 100 may be applicable to various technologies, including but not limited to, complementary metal-oxide-semiconductors (CMOS), silicon-on-insulator (SOI), Gallium-Arsenide (GaAs), and Silicon-Germanium (SiGe). Because the physical depictions in the figures should not be interpreted as limiting, fin-based semiconductor device 100 may be applicable to double-gate transistors, tri-gate transistors, all-around-gate transistors, and various other implementations of semiconductor devices with vertical structures above substrate 102.

Fin-based semiconductor device 100 may be an n-type metal-oxide-semiconductor (NMOS) structure or a p-type metal-oxide-semiconductor (PMOS) structure. Fin-based semiconductor device 100 may include a semiconductor layer (not shown) implanted in substrate 102. In some aspects, the semiconductor layer may include wells and shallow trench isolation (STI) regions.

In one or more implementations, substrate 102 is a p-type substrate made of p-type material. The p-type material may be obtained by a doping process by adding a certain type of atoms to the semiconductor in order to increase the number of positive carriers (holes). Alternatively, substrate 102 may be an n-type substrate.

In some aspects, an integrated circuit can be formed using multiple semiconductor fins along an axis that is orthogonal with gate structures (or poly-silicon layers) running parallel to one another across the integrated circuit. The intersection of semiconductor fin structure 104 and gate structure 106 over an active material deposited on substrate 102 forms a transistor. As such, the integrated circuit can be arranged as a grid where multiple grid points represent this intersection. Accordingly, each transistor can be located at a corresponding grid point of the integrated circuit based on the spatial relationship between semiconductor fin structure 104 and gate structure 106. In this respect, the spacing between the multiple semiconductor fins may define a fin pitch. Similarly, the spacing between the gate structures may define a gate pitch.

In one or more implementations, oxide layer 112 is disposed above substrate 102 and in contact with semiconductor fin structure 104 and gate structure 106 to separate gate structure 106 from substrate 102. Fin-based semiconductor device 100 is not limited to the implementation shown in FIG. 1, and can be implemented with various configurations and structures.

Figure 2B:
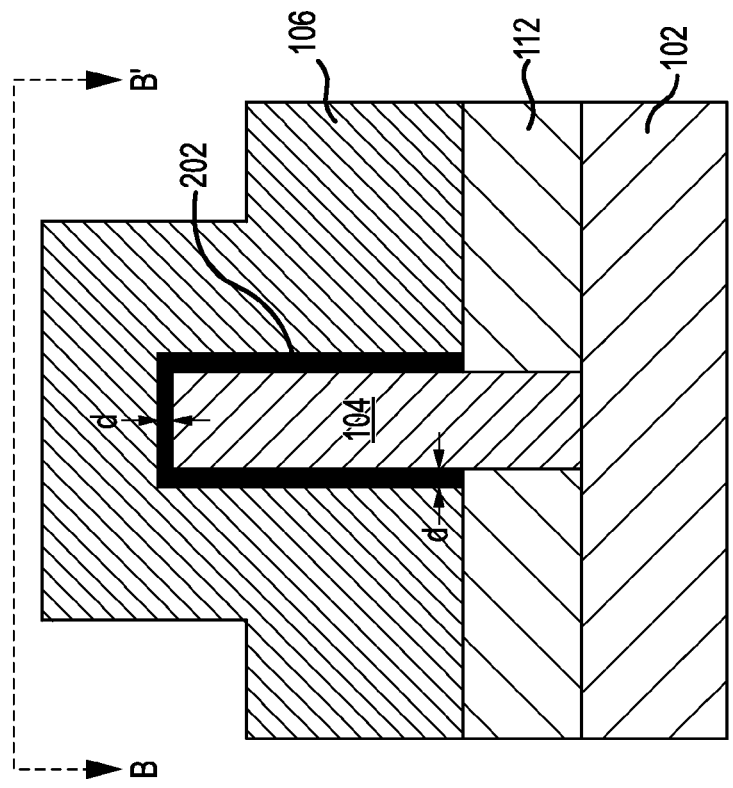
FIGS. 2A and 2B show cross-sectional views of the fin-based semiconductor device along multiple axes in FIG. 1 according to one or more implementations.
Figure 2A:
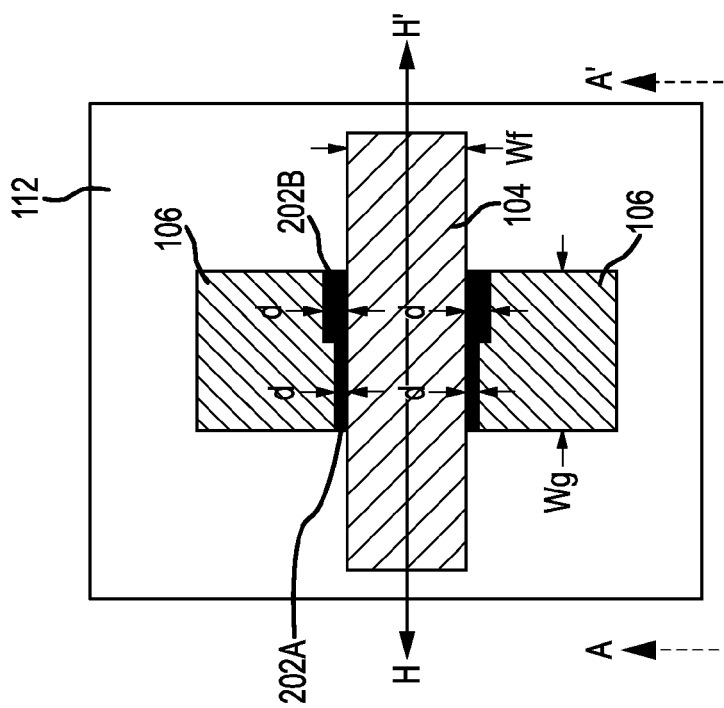

FIGS. 2A and 2B show cross-sectional views of fin-based semiconductor device 100 along multiple axes in FIG. 1 according to one or more implementations. Referring to FIG. 2A, a cross-sectional view of fin-based semiconductor device 100 along an A-A' axis is provided. As shown in FIG. 2A, fin-based semiconductor device 100 includes gate oxide region 202. Gate oxide region 202 includes first gate oxide 202A and second gate oxide 202B, which will be discussed in further detail below. Epitaxial structures can be found on distal ends of semiconductor fin structure 104. Depending on implementation, current flows between the source and drain portions of semiconductor fin structure 104. In some aspects, semiconductor fin structure 104 can have a relatively thin width when compared to a width of gate structure 106. A width of gate structure 106 "$w_g$" may be parallel to the channel axis. A width of semiconductor fin structure 104 "$w_f$" may be perpendicular to the channel axis.

Gate oxide breakdown, also known as oxide rupture or oxide punch-through, refers to destruction of gate oxide region 202. The gate oxide breakdown results from a build-up of defects inside gate oxide region 202 which eventually leads to a creation of a conductive path in gate oxide region 202 from gate structure 106 to semiconductor fin structure 104. For example, a hot carrier effect may cause the defects inside gate oxide region 202. The hot carrier effect refers to an effect of high energy carrier electrons and/or carrier holes generated as a result of impact ionization at the channel region. These high energy current carriers may leave the substrate 102 and may, upon reaching a sufficiently high level of energy, tunnel into gate oxide region 202 to cause the defects.

The gate oxide breakdown commences by the formation of the defects in gate oxide region 202. At first, the defects are relatively small in number and do not form the conductive path in gate oxide region 202. As the number of defects in gate oxide region 202 increase, they eventually reach a point at which the conductive path forms in gate oxide region 202 causing a soft breakdown. Movement of electrons from semiconductor fin structure 104 to gate structure 106 via the conductive path in gate oxide region 202 further heats up gate oxide region 202, which further increases the current flow through the conductive path. This increase in heat leads to more defects in gate oxide region 202, thereby enlarging the conductive path and/or causing new conductive paths to form in gate oxide region 202. As a result of the enlarged the conductive path and/or the new conductive paths, more defects form in gate oxide region 202 eventually leading to a hard breakdown of gate oxide region 202. The hard breakdown of gate oxide region 202 causes gate oxide region 202 to melt resulting in one or more permanent conductive paths in gate oxide region 202 from semiconductor fin structure 104 to gate structure 106. In some aspects, gate oxide region 202 may be high-K material, nitrided-oxide, oxide, or any suitable material that can tolerate TDDB, HCI, or NBTI factors Fin-based semiconductor device 100 may be formed using CMOS logic foundry technology. The CMOS logic foundry technology may include one or more minimum design rules corresponding to one or more operating voltages. The minimum design rules represent minimum sizes of components of fin-based semiconductor device 100 and/or distances between the components of fin-based semiconductor device 100 in accordance with the CMOS logic foundry. The CMOS logic foundry technology may include a specialized set of minimum design rules, such as a first set of minimum design rules for a low operating voltage process and/or a second set of minimum design rules for a high operating voltage process to provide some examples, for a corresponding operating voltage. The low operating voltage process can be used for lower power devices with thinner gate oxides when compared with the high operating voltage process.

A multi-gate FET RF device may be formed with the CMOS logic foundry technology using a combination of the low operating voltage process and the high operating voltage process. A gate oxide layer can be formed using a thick gate oxide corresponding to the high operating voltage process. Alternatively, the gate oxide layer can be formed using a thin gate oxide corresponding to the low operating voltage process. The thick gate oxide increases the breakdown voltage of fin-based semiconductor device 100 when compared to the thin gate oxide of the low operating voltage process. In some aspects, the thin gate oxide of the low operating voltage process may have a thickness of 2 Å, whereas the thick gate oxide of the high operating voltage process may have a thickness of 4 Å.

As shown in FIG. 2A, a split multi-gate architecture is provided. Gate oxide region 202 includes a first region, referred to as first gate oxide 202A, having a first thickness and a second region, referred to as second gate oxide 202B, having a second thickness. In some aspects, the first thickness may be approximately equal to the thin gate oxide of the high operating voltage process and the second thickness may be approximately equal to the thick gate oxide of the low operating voltage process. The first thickness and the second thickness may be predefined by the foundry.

In one or more aspects, first gate oxide 202A and second gate oxide 202B are formed side-by-side along a channel axis H-H' in gate oxide region 202 so that the length of first gate oxide 202A and the length of second gate oxide 202B are along the channel axis. A channel axis may be an axis extending between source 108 and drain 110. A channel axis may be parallel to a channel and be formed between source 108 and drain 110 during operation. The thickness of gate oxide region 202 may be defined by a distance "d" between gate structure 106 and semiconductor fin structure 104. A distance "d" may be perpendicular to the channel axis. As such, the distance corresponding to the thick gate oxide is greater than the distance corresponding to the thin gate oxide. In this respect, the distance associated with second gate oxide 202B may be greater than the distance associated with first gate oxide 202A.

Referring to FIG. 2B, a cross-sectional view of fin-based semiconductor device 100 along an B-B' axis is provided. As shown in FIG. 2B, fin-based semiconductor 100 includes gate oxide region 202. Semiconductor fin structure 104 is disposed above substrate 102, and runs through gate structure 106. In effect, gate structure 106 straddles or surrounds semiconductor fin structure 104. That is, gate structure 106 can be formed over and around at least three sides of semiconductor fin structure 104.

In some aspects, gate oxide region 202 serves as an insulator between gate structure 106 and semiconductor fin structure 104. Gate oxide region 202 is formed beneath gate structure 106 and in contact with gate structure 106. Gate oxide region 202 can wrap partially around semiconductor fin structure 104 to separate semiconductor fin structure 104 and gate structure 106. Gate oxide region 202 includes first gate oxide 202A and second gate oxide 202B. Fin-based semiconductor device 100 also includes oxide layer 112 above substrate 102. Gate oxide region 202 may be formed using a dielectric material such as silicon dioxide ($SiO_2$), though any suitable material may be used. In some aspects, gate oxide region 202 may be high-K material, nitrided-oxide, oxide, or any suitable material that can tolerate TDDB, HCI, or NBTI factors.

Fin-based semiconductor device 100 may be fabricated using a 16 nanometer (nm) minimum design rule foundry technology. However, fin-based semiconductor device 200 may be fabricated using any suitable minimum design rule foundry technology without departing from the scope of the subject technology.

Multiple transistor structures can be offered by semiconductor foundries. In some aspects, the transistor structures include, but not limited to, PMOS transistors and NMOS transistors with high threshold voltage (Vt) or low Vt; thick gate dielectric or thin gate dielectric; and various combinations of the foregoing. It is further noted that transistor structures are often adapted for use in a "core" region of a chip, or in an "I/O" (Input/Output) or "peripheral" region of a chip. FETs used in the core region can have thin gate dielectric layers to operate at low operating voltages, whereas FETs used in the I/O or peripheral regions can have relatively thicker gate dielectric layers and operate at relatively higher operating voltages. As explained in greater detail below, some implementations may take advantage of manufacturing operations available in such existing processes to fabricate new transistor structures.

Disclosed herein are structures of FETs having a unique combination of properties, that are operable to interface with relatively high voltage signals (similar to I/O transistors), and to simultaneously operate with relatively high cut-off frequency bands ($f_T$) (similar to core transistors). It is noted that $f_T$ refers to the frequency at which the small signal gain of the transistor drops to unity.

Core transistors (e.g., transistors operating in the core region) can switch at high speed but operate at low voltage, whereas I/O transistors (e.g., transistors operating in the I/O region) can operate at high voltage but switch at lower speeds. Compared to core transistors, FETs in accordance with one or more implementations advantageously receive high voltage signals while switching at high speed. As compared to I/O transistors, FETs in accordance with one or more implementations can switch at high speed while receiving high voltage signals.

Another advantage of FETs in accordance with one or more implementations, is that no additional process operations are needed to construct the transistor structures in accordance with one or more implementations of the subject technology. In order to implement the transistor structures according to one or more implementations, only newly designed mask layouts may be needed to create the split gate dielectric effective oxide thickness.

FIGS. 3A-3C show cross-sectional views of the fin-based semiconductor device 100 along a C-C' axis in FIG. 1 according to one or more implementations. Referring to FIG. 3A, fin-based semiconductor device 310 includes gate structure 106 disposed above substrate 102. Fin-based semiconductor device 310 includes semiconductor fin structure 104 disposed above substrate 102 and in contact with substrate 102. Fin-based semiconductor device 310 also includes gate oxide region 202 in contact with gate structure 106, in which gate oxide region 202 has a first region with a first thickness and a second region with a second thickness. In some aspects, the second thickness is greater than the first thickness. Fin-based semiconductor device 310 is substantially similar to fin-based semiconductor device 100 as described above, therefore, only differences are to be described in further detail.

As shown in FIG. 3A, gate oxide region 202 includes first gate oxide 202A and second gate oxide 202B. Here, the first region thickness (or first gate oxide 202A) is less than the second region thickness (or second gate oxide 202B). The first region of the gate oxide region (or first gate oxide 202A) may have a first dielectric constant and the second region of the gate oxide region (or second gate oxide 202B) may have a second dielectric constant. In some aspects, the second dielectric constant is greater than the first dielectric constant and the first region length is equivalent to the second region length. For example, the length of $L_{GATE\ OXIDE\ 1}$ may be substantially equivalent to the length of $L_{GATE\ OXIDE\ 2}$. In this regard, fin-based semiconductor device 310 can experience a relatively large cut-off frequency band when second gate oxide 202A is associated with the low operating voltage while receiving the reliability against certain gate oxide breakdown factors (e.g., TDDB, HCI). In one or more implementations, the first dielectric constant may be greater than the second dielectric constant while the first region length remains the same as the second region length.

First gate oxide 202A may have a thickness that is greater than a thickness of second gate oxide 202B. As such, a portion of gate structure 106 disposed above first gate oxide 202A can be offset from a portion of gate structure 106 disposed above second gate oxide 202B. In this regard, both portions of gate structure 106 are uniform in area. In some aspects, a top surface of gate structure 106 remains uniform across the length of gate oxide region 202 but the respective portions of gate oxide region 202 are non-uniform in area.

Gate oxide region 202 is positioned beneath gate structure 106. Gate oxide region 202 may extend from a first side to a second side of semiconductor fin structure 104 for a length of $L_{GATE\ OXIDE}$. The length of gate oxide region 202 may be represented as $L_{GATE\ OXIDE} = L_{GATE\ OXIDE\ 1} + L_{GATE\ OXIDE\ 2}$, where $L_{GATE\ OXIDE}$ represents the length of gate oxide region 202, $L_{GATE\ OXIDE\ 1}$ represents a length of the first gate oxide 202A, namely a first horizontal distance from first side 312A of first gate oxide 202A to second side 312B of first gate oxide 202A, and $L_{GATE\ OXIDE\ 2}$ represents a length of second gate oxide 202B, namely a second horizontal distance from first side 314A of second gate oxide 202B to second side 314B of second gate oxide 214B.

First gate oxide 202A may extend from first side 312A, with respect to at least some of semiconductor fin structure 104, and above at least substrate 102 to second side 312B for the length of $L_{GATE\ OXIDE\ 1}$. Second side 312B of first gate oxide 202A may be positioned adjacent to and/or in contact with first side 314A of second gate oxide 202B to form an oxide junction. Second gate oxide 202B may extend with respect to at least some of semiconductor fin structure 104 to second side 314B for the length of $L_{GATE\ OXIDE\ 2}$. The length of $L_{GATE\ OXIDE\ 1}$ may be substantially equal to the length of $L_{GATE\ OXIDE\ 2}$. In some aspects, the length of $L_{GATE\ OXIDE\ 1}$ may be different from the length of $L_{GATE\ OXIDE\ 2}$.

From the discussion above, the CMOS logic foundry technology may include a specialized set of minimum design rules, such as a first set of minimum design rules for the low operating voltage process and/or a second set of minimum design rules for the high operating voltage process to provide a corresponding operating voltage. In some aspects, the CMOS logic foundry technology may include a first set of minimum design rules for a low operating voltage process of 1.2V, also referred to as a 1.2V process, and a high operating voltage process of 3.3V, also referred to as a 3.3V process. In some aspects, the CMOS logic foundry technology may include a first set of minimum design rules for a low operating voltage process of 0.9V, and a high operating voltage process of 1.8V, also referred to as a 1.8V process. The low operating voltage process can be used for lower power devices with thinner gate oxides when compared with the high operating voltage process using a thicker gate oxide.

The lengths of first gate oxide 202A and second gate oxide 202B may depend on design requirements such as cutoff frequency ($f_t$), time-dependent dielectric breakdown (TDDB), and hot carrier injection (HCI). That is, $L_{GATE\ OXIDE}$ may be limited by TDDB, HCI and NBTI factors. In some implementations, $L_{GATE\ OXIDE}$ may be the sum of the minimum size feature of a thin gate oxide, represented as $L_{GATE\ OXIDE\ 1}$, and a length of a thick gate oxide, represented as $L_{GATE\ OXIDE\ 2}$, that minimizes the effects of TDDB, HCI and NBTI for a given supply voltage (e.g., $V_{DD}$). In some aspects, the amount of voltage applicable to gate structure 106 (e.g., $V_{GS}$) may be limited by the thin gate oxide thickness, gate oxide material (e.g., $SiO_2$), and the reliability factors (e.g., TDDB, HCI, NBTI).

In some implementations, the ratio between a first length referred to as the length of first gate oxide 202A in the first region and a second length referred to as the length of second gate oxide 202B in the second region varies depending on the cut-off frequency performance of fin-based semiconductor device 310. In this regard, a thin oxide thickness can produce a cut-off frequency band beyond 100 Gigahertz for an advance complementary metal-oxide-semiconductor (CMOS) technology process such as 90 nm and below. Alternatively, a thick oxide thickness produces a cut-off frequency of less than 100 Gigahertz but with greater reliability compared to the thin oxide thickness.

In some aspects, a first ratio of the first length to the second length based on a first supply voltage is greater than a second ratio of the first length to the second length based on a second supply voltage if the first supply voltage is greater than the second supply voltage. In one or more implementations, the gate supply voltage (e.g., voltage applied to gate node of transistor) is lower than the first and second supply voltages.

By way of illustration without limiting the scope of the subject technology, if the supply voltage (e.g., $V_{DD}$) increases, the cut-off frequency will decrease, such that the length of the thick oxide thickness region is increased. In this regard, the ratio of the thin thickness to the thick thickness will decrease. Alternatively, if the supply voltage decreases, the cut-off frequency increases, such that the length of the thin oxide thickness region is increased. Conversely, the ratio of the thin thickness region to the thick thickness region will increase. In some aspects, the minimum oxide region length (or $L_{GATE\ OXIDE\ MIN}$) is 20 nanometers for a 20 nm process, and 16 nm for a 16 nm process. If the supply voltage can be decreased, the oxide region length can be relatively decreased as well.

As shown in FIG. 3B, fin-based semiconductor device 320 includes gate oxide 202. Gate oxide 202 includes first gate oxide 202A and second gate oxide 202B. First gate oxide 202A may extend along the C-C' axis from first side 322A to second side 322B towards second gate oxide 202B for the length of $L_{GATE\ OXIDE\ 1}$. In some aspects, the first dielectric constant is equivalent to the second dielectric constant and the first region length (or $L_{GATE\ OXIDE\ 1}$) is different from the second region length (or $L_{GATE\ OXIDE\ 2}$). For example, the length of $L_{GATE\ OXIDE\ 1}$ may be substantially greater than the length of $L_{GATE\ OXIDE\ 2}$. $L_{GATE\ OXIDE\ 2}$ may be defined by the distance between first side 324A and second side 324B. In this regard, fin-based semiconductor device 320 can experience a relatively larger cut-off frequency band than FIG. 3A when first gate oxide 202A is associated with the low operating voltage.

As shown in FIG. 3C, fin-based semiconductor device 330 includes gate oxide 202. Gate oxide 202 includes first gate oxide 202A, and a second region, referred to as second gate oxide 202B. First gate oxide 202A and second gate oxide 202B are substantially similar to first gate oxide 202A and second gate oxide 202B as described above, therefore, only differences are to be described in further detail.

Second gate oxide 202B may extend along the C-C' axis from second side 334B to first side 334A towards first gate oxide 202A for the length of $L_{GATE\ OXIDE\ 2}$. In some aspects, the first dielectric constant is equivalent to the second dielectric constant and the first region length (or $L_{GATE\ OXIDE\ 1}$) is different from the second region length (or $L_{GATE\ OXIDE\ 2}$). For example, the length of $L_{GATE\ OXIDE\ 1}$ may be substantially less than the length of $L_{GATE\ OXIDE\ 2}$. $L_{GATE\ OXIDE\ 1}$ may be defined by the distance between first side 332A and second side 332B. In this regard, fin-based semiconductor device 330 can experience a relatively smaller cut-off frequency band than FIG. 3A when second gate oxide 202B is associated with the high operating voltage.

FIGS. 4A-4C show multiple views of semiconductor device 400 with epitaxial source/drain growth according to one or more implementations. Fin-based semiconductor device 400 is substantially similar to fin-based semiconductor device 100 as described above, therefore, only differences are to be described in further detail.

Referring to FIG. 4A, first raised terminal structure 402 referred to as either a source or a drain electrode, depending on implementation, is disposed above and in contact with semiconductor fin structure 104. The first raised terminal structure 402 may be connected to gate structure 106 through semiconductor fin structure 104. In an NMOS implementation, first raised terminal structure 402 may be implanted with N+ material.

Second raised terminal structure 404 is disposed above and in contact with semiconductor fin structure 104. Semiconductor fin structure 104 extends into second raised terminal structure, which is formed by in-situ doping during epitaxial growth. First and second raised terminal structures 402 and 404 can include at least one of the materials such as n-type dopants and Silicon Carbide (SiC). The shape of the epitaxial growth is not limited to the shape shown in FIG. 4A. Semiconductor fin structure 104 may have a length between 0 nm and 100 nm.

In some aspects, semiconductor fin structure 104 can include multiple semiconductor fin structures such that first raised terminal structure 402 is connected to a first semiconductor fin structure (not shown) and second raised terminal structure 404 is connected to a second semiconductor fin structure (not shown).

FIG. 4B illustrates a cross-section along the A-A' axis of fin-based semiconductor device 400 according to one or more implementations. In some aspects, gate structure 106 has a respective width "$w_g$" and semiconductor fin structure 104 may have a respective width "$w_f$", in which the respective width of gate structure 106 is greater than the width of semiconductor fin structure 104. Similarly, first raised terminal structure 402 may have a respective width "$w_1$" that is greater than the respective width of semiconductor fin structure 104. Further, second raised terminal structure 404 may have a respective width "$w_2$" that is greater than the respective width of semiconductor fin structure 104. A width of first raised terminal structure 402 may be perpendicular to the channel axis. Similarly, a width of second raised terminal structure 404 may be perpendicular to the channel axis.

FIG. 4C illustrates a cross-section along the B-B' axis of fin-based semiconductor device 400 according to one or more implementations. As shown in FIG. 4C, fin-based semiconductor 400 includes gate oxide region 202. Semiconductor fin structure 104 is disposed above substrate 102, and runs through gate structure 106. In effect, gate structure 106 straddles or surrounds semiconductor fin structure 104. That is, gate structure 106 can be disposed over and around at least three sides of semiconductor fin structure 104.

Figure 5:
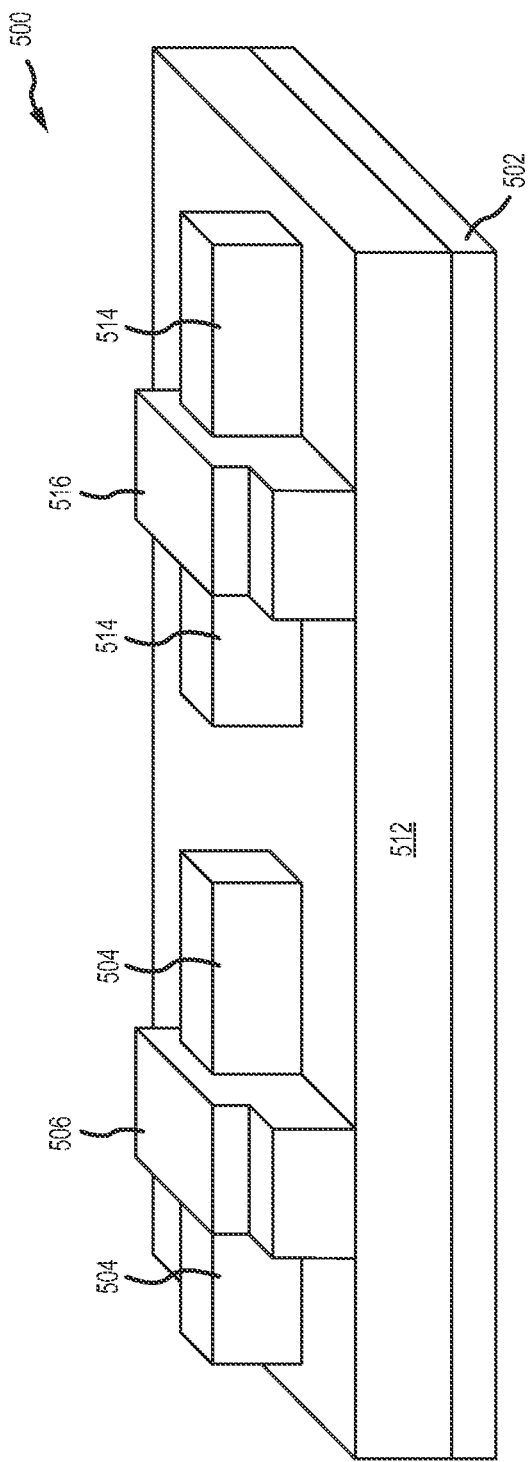
FIG. 5 shows a circuit device in accordance with one or more implementations.

FIG. 5 shows a circuit device 500 in accordance with one or more implementations. The circuit device 500 includes a semiconductor device and a second semiconductor device. The semiconductor device includes a substrate 502, a gate structure 506 above the substrate 502 and orthogonal to a channel axis, a semiconductor fin structure 504 above the substrate 502 along the channel axis, and a gate oxide region beneath the gate structure 506 and in contact with the gate structure 506 and the semiconductor fin structure 504. The gate oxide region can have a first region (e.g., first gate oxide 202A in FIG. 2A) and a second region (e.g., second gate oxide 202B in FIG. 2A) formed side-by-side along the channel axis. The first region can have a first thickness (e.g., distance "d" in FIG. 2A) and a first length (e.g., length $L_{THIN}$ in FIG. 3A). The second region can have a second thickness and a second length (e.g., length $L_{THICK}$ in FIG. 3A). The first thickness can be greater than the second thickness.

The second semiconductor device includes the substrate 502, a second gate structure 516 above the substrate 502 and orthogonal to the channel axis, a second semiconductor fin structure 514 above the substrate 502 along the channel axis, and a second gate oxide region beneath the second gate structure 516 and in contact with the second gate structure 516 and the second semiconductor fin structure 514. The second gate oxide region can have a first region and a second region. The first region can have a first thickness and a first length. The second region can have a second thickness and a second length. The first thickness can be greater than the second thickness. In some aspects, the first length of the semiconductor device can be greater than the first length of the second semiconductor device. For example, the first length of the semiconductor device can be $L_{THIN}$ shown in FIG. 3A and the first length of the second semiconductor device can be $L_{THIN}$ shown in FIG. 3C.

In some aspects, a first ratio of the first length to the second length of the gate oxide region is based on a first supply voltage, and a second ratio of the first length to the second length of the second gate oxide region is based on a second supply voltage. The first ratio is greater than the second ratio if the first supply voltage is greater than the second supply voltage.

As used herein, the terms, chip, die, integrated circuit, semiconductor device, and microelectronic device, are applicable to the subject technology as these terms can be used interchangeably in the field of electronics. With respect to a chip, power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips can be made by way of electrical conductors, chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium can be all related. The related terms listed above, can be interchangeable, and appear in order from specific to general. In the field of electronics, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to as polysilicon, or sometimes more simply as poly. It is noted that polysilicon is commonly used to form the gate electrode of a FET. An alternative use of polysilicon is as a sacrificial gate electrode that is removed and replaced with a metal gate, or any other suitable material, during the manufacturing process.

FET refers to a metal-oxide-semiconductor field effect transistor (MOSFET). An n-channel FET is referred to herein as an NFET. A p-channel FET is referred to herein as a PFET. FETs that are formed in a bulk substrate, such as a silicon wafer, have four terminals, namely gate, drain, source and body. FETs can be formed in SOI substrates, and other various substrates with differential material types.

Effective oxide thickness refers to the thickness of a layer of Silicon Dioxide ($SiO_2$) that is electrically equivalent to a given thickness of a material having a given dielectric constant. The thickness of the layer may refer to the distance between the semiconductor fin structure and the gate structure. In many circumstances it is the electrical characteristic of a dielectric layer (which is proportional to layer thickness/dielectric constant) that is of interest rather than the actual physical thickness of the layer. Since there are a variety of materials available for use as gate dielectrics, for the sake of comparison, discussion of these gate dielectrics can be in terms of a normalized value such as effective oxide thickness. By way of example, since Hafnium Oxide (HfO$_2$) has a dielectric constant of 25 (compared to 3.9 for SiO$_2$), a 6.4 nm layer of HfO$_2$ has an effective oxide thickness of 1 nm. In other words, a high dielectric constant material can be electrically equivalent to a thinner layer of lower dielectric constant material.

As used herein, "gate" may refer to an insulated gate terminal of a FET. The physical structure of the gate terminal is referred to as a gate electrode. In terms of the layout of an integrated circuit, the gate electrode is the logical AND of the polysilicon layer with the layer representing an active portion of the semiconductor surface.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals, these terminals can be simply referred to as source/drain terminals, and this nomenclature is used herein. Designers often designate a particular source/drain terminal to be a "source" or a "drain" on the basis of the voltage to be applied to that terminal when the FET is operated in a circuit.

The terms contact and via, both refer to structures in a chip used for electrical connection of conductors from different interconnect levels of the chip. These terms can describe both an opening in an insulator in which the structure will be completed, and the completed structure itself. For purposes of this disclosure, contact and via both refer to the completed structure.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g. glass), or combinations of semiconducting and non-semiconducting materials (e.g., silicon-on-insulator (SOI)). In the semiconductor industry, a bulk silicon wafer is a very commonly used substrate for the manufacture of integrated circuits.

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

The predicate words "configured to" and "operable to" do not imply any particular tangible or intangible modification of a subject, but, rather, are intended to be used interchangeably. In one or more implementations, a receiver configured to receive and process an operation or a component may also mean the receiver being operable to receive and process the operation.

Terms such as "top," "bottom," "front," "rear," "side," "horizontal," "vertical," and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. Such disclosure may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit device, comprising:
   a semiconductor device comprising:
      a substrate;
      a gate structure above the substrate and orthogonal to a channel axis;
      a semiconductor fin structure above the substrate along the channel axis; and
      a gate oxide region beneath the gate structure and in contact with the gate structure and the semiconductor fin structure, the gate oxide region having a first region with a first thickness and a first length, the gate oxide region having a second region with a second thickness and a second length, the first thickness greater than the second thickness, the first region and the second region formed side-by-side along the channel axis.

2. The circuit device of claim 1, wherein the first length is greater than the second length.

3. The circuit device of claim 1, wherein the second length is greater than the first length.

4. The circuit device of claim 1, comprising:
   a second semiconductor device comprising:
      the substrate;
      a second gate structure above the substrate and orthogonal to the channel axis;
      a second semiconductor fin structure above the substrate along the channel axis; and
      a second gate oxide region beneath the second gate structure and in contact with the second gate structure and the second semiconductor fin structure, the second gate oxide region having a first region with a first thickness and a first length and a second region with a second thickness and a second length, the first thickness greater than the second thickness,
   wherein the first length of the semiconductor device is greater than the first length of the second semiconductor device.

5. The circuit device of claim 4, wherein a first ratio of the first length to the second length of the gate oxide region is based on a first supply voltage, wherein a second ratio of the first length to the second length of the second gate oxide region is based on a second supply voltage, and wherein the first ratio is greater than the second ratio if the first supply voltage is greater than the second supply voltage.

6. The circuit device of claim 1, wherein the first region of the gate oxide region has a first dielectric constant and the second region of the gate oxide region has a second dielectric constant, wherein the first dielectric constant is equivalent to the second dielectric constant.

7. The circuit device of claim 1, wherein the first region of the gate oxide region has a first dielectric constant and the second region of the gate oxide region has a second dielectric constant, wherein the first dielectric constant is greater than the second dielectric constant.

8. The circuit device of claim 1, wherein the first region of the gate oxide region has a first dielectric constant and the second region of the gate oxide region has a second dielectric constant, wherein the second dielectric constant is greater than the first dielectric constant.

9. The circuit device of claim 1, wherein the gate structure has a first width and the semiconductor fin structure has a second width, the first width greater than the second width.

10. The circuit device of claim 1, comprising:
    a first raised terminal structure coupled to the gate structure through the semiconductor fin structure; and
    a second raised terminal structure coupled to the gate structure through the semiconductor fin structure.

11. The circuit device of claim 10, wherein the first raised terminal structure has a first width and the semiconductor fin structure has a second width, the first width greater than the second width.

12. The circuit device of claim 10, wherein the second raised terminal structure has a first width and the semiconductor fin structure has a second width, the first width greater than the second width.

13. A semiconductor device comprising:
    a semiconductor substrate of a first type;
    a gate structure above the semiconductor substrate;
    a semiconductor fin structure above the substrate along a channel axis;
    a gate oxide region in contact with the gate structure, the gate oxide region comprising a first region having a thickness and a length and a second region having a thickness and a length, the first region thickness and the second region thickness being different;
    a first raised terminal structure of a second type coupled to the gate structure through the semiconductor fin structure; and
    a second raised terminal structure of the second type coupled to the gate structure through the semiconductor fin structure,
    wherein the first region and the second region are formed side-by-side along the channel axis.

14. The semiconductor device of claim 13, wherein the first region thickness is greater than the second region thickness.

15. The semiconductor device of claim 13, wherein the first region of the gate oxide region has a first dielectric constant and the second region of the gate oxide region has a second dielectric constant, wherein the first dielectric constant is equivalent to the second dielectric constant and the first region length is different from the second region length.

16. The semiconductor device of claim 13, wherein the first region of the gate oxide region has a first dielectric constant and the second region of the gate oxide region has a second dielectric constant, wherein the first dielectric constant is greater than the second dielectric constant and the first region length is equivalent to the second region length.

17. The semiconductor device of claim 13, wherein the first region of the gate oxide region has a first dielectric constant and the second region of the gate oxide region has a second dielectric constant, wherein the second dielectric constant is greater than the first dielectric constant and the first region length is equivalent to the second region length.

18. The semiconductor device of claim 13, wherein the semiconductor device is formed using a logic foundry technology having a first operating voltage and a second operating voltage, the first operating voltage being less than the second operating voltage, wherein the second region thickness is associated with the second operating voltage and the first region thickness is associated with the first operating voltage.

19. The semiconductor device of claim 13, wherein the first type is p-type material and the second type is n-type material.

20. The semiconductor device of claim 13, wherein the first type is n-type material and the second type is p-type material.

* * * * *